United States Patent
Ziegler et al.

(10) Patent No.: US 7,077,935 B2
(45) Date of Patent: Jul. 18, 2006

(54) $O_2$ AND $H_2O$ BARRIER MATERIAL

(75) Inventors: John P. Ziegler, San Diego, CA (US); John R. Piner, Oceanside, CA (US)

(73) Assignee: General Atomics, San Diego, CA (US)

( * ) Notice: Subject to any disclaimer, the term of this patent is extended or adjusted under 35 U.S.C. 154(b) by 217 days.

(21) Appl. No.: 10/478,221

(22) PCT Filed: May 1, 2002

(86) PCT No.: PCT/US02/14218

§ 371 (c)(1),
(2), (4) Date: Nov. 17, 2003

(87) PCT Pub. No.: WO02/091064

PCT Pub. Date: Nov. 14, 2002

(65) Prior Publication Data

US 2004/0209126 A1  Oct. 21, 2004

Related U.S. Application Data

(60) Provisional application No. 60/288,755, filed on May 4, 2001.

(51) Int. Cl.
  *C23C 14/34* (2006.01)
  *C23C 16/00* (2006.01)
(52) U.S. Cl. .............. 204/192.14; 427/536; 427/539; 427/322
(58) Field of Classification Search ........... 204/192.14; 427/533, 534, 536, 539, 551, 566, 585, 587, 427/595, 596, 322
See application file for complete search history.

(56) References Cited

U.S. PATENT DOCUMENTS

| | | | |
|---|---|---|---|
| 3,315,111 A | 4/1967 | Jaffee et al. ............. 313/108 |
| 4,527,863 A | 7/1985 | Glasper et al. ........... 350/336 |
| 4,674,840 A | 6/1987 | Bennett .................... 350/337 |
| 4,696,719 A | 9/1987 | Bischoff ................... 202/205 |
| 4,709,991 A | 12/1987 | Hoshikawa ............... 350/339 |
| 4,842,893 A | 6/1989 | Yializis et al. ........... 427/44 |
| 4,886,681 A * | 12/1989 | Clabes et al. ............. 427/525 |
| 4,954,371 A | 9/1990 | Yializis ..................... 427/44 |
| 5,032,461 A | 7/1991 | Shaw et al. ............... 428/461 |
| 5,215,822 A | 6/1993 | Wyman et al. |
| 5,434,008 A | 7/1995 | Felts ......................... 428/461 |
| 5,593,794 A | 1/1997 | Wei et al. ................. 429/91 |
| 5,654,084 A | 8/1997 | Egert ........................ 428/215 |
| 5,681,666 A | 10/1997 | Treger et al. ............. 429/90 |
| 5,686,360 A | 11/1997 | Harvey, III et al. ...... 437/211 |
| 5,736,207 A | 4/1998 | Walther et al. ........... 428/34.7 |
| 5,757,126 A | 5/1998 | Harvey, III et al. ...... 313/506 |
| 5,767,931 A | 6/1998 | Paczkowski ............... 349/158 |
| 5,910,374 A | 6/1999 | Shah ......................... 428/474.4 |
| 6,054,188 A | 4/2000 | Tropsha et al. ........... 427/488 |
| 6,162,892 A | 12/2000 | Kobayashi et al. ....... 528/310 |
| 6,165,566 A | 12/2000 | Tropsha .................... 427/536 |
| 6,198,217 B1 | 3/2001 | Suzuki et al. ............. 313/504 |
| 6,251,334 B1 | 6/2001 | Lewis ........................ 264/517 |
| 6,268,695 B1 | 7/2001 | Affinito .................... 313/504 |
| 6,333,065 B1 | 12/2001 | Arai et al. ................. 427/66 |
| 6,465,953 B1 * | 10/2002 | Duggal ..................... 313/553 |
| 6,566,805 B1 * | 5/2003 | Tsai et al. ................. 313/504 |
| 6,573,652 B1 * | 6/2003 | Graff et al. ............... 313/512 |
| 6,630,980 B1 * | 10/2003 | Sobrinho .................. 349/158 |
| 2001/0019747 A1 | 9/2001 | Affinito .................... 427/569 |

FOREIGN PATENT DOCUMENTS

JP  05-295528  * 11/1993

OTHER PUBLICATIONS

Machine Translation of 05-295528.*
International Search Report for International Application No. PCT/US02/14218, issued on Nov. 14, 2002.

* cited by examiner

*Primary Examiner*—Rodney G. McDonald
(74) *Attorney, Agent, or Firm*—Fitch, Even, Tabin & Flannery

(57) ABSTRACT

$O_2$ and $H_2O$ barrier materials suitable for the protection of LCDs and flexible OLEDs are fabricated on a polymer substrate using dense inorganic barrier layers. A polymer surface having a low surface roughness has an inorganic layer of aluminum or silicon oxides deposited thereupon using ion-assisted vacuum deposition with an argon ion gun, which treatment surprisingly provides a smoothing effect on the surface of the polymer. By pretreatment of prefabricated polymeric film with ion-gun enhanced plasma in the presence of oxygen, commercially available heat-stabilized PET and PEN films can be directly employed as substrates. Protective polymer layers are optionally coated upon the thin inorganic barrier layer.

22 Claims, No Drawings

O₂ AND H₂O BARRIER MATERIAL

This application claims priority from provisional application Ser. No. 60/288,755, filed May 4, 2001, and is a § 371 filing of PCT/US02/14218, filed May 1, 2002.

This invention relates to barrier materials which resist the passage of oxygen and water, and more particularly to methods of making barrier materials, including flexible barrier materials, which strongly resist the passage therethrough of atmospheric oxygen and/or moisture and have overall improved characteristics. Reference is made to pending provisional application Ser. No. 60/288,755, filed May 4, 2001, from which priority is being claimed, and the disclosure of which is incorporated herein by reference.

BACKGROUND OF THE INVENTION

Liquid crystal displays (LCDs) have been employed in greater numbers since RCA made the first experimental LCD in 1968 and are widely used in wrist watches and flat panel displays for calculators, and also in computer and TV screens. However, liquid crystal materials emit no light of their own and thus require an external light source; for example, many laptop computer LCD panels are lit by fluorescent tubes, such as cold cathode fluorescent lamps, which are associated therewith. Subsequently, more economical discrete light-emitting devices and displays have been made possible through the phenomenon of electroluminescence (EL), and flat panel displays on glass have become commercial and are termed light-emitting devices (LEDs). More recently, organic materials are beginning to be employed to replace conventional inorganic materials previously used in LEDs, and this new class of materials has become referred to organic LEDs or OLEDs. There are projects presently funded by the Defense Advanced Research Projects Agency (DARPA) to develop flexible OLEDs (FOLEDs) that will bend and roll-up.

Organic luminescent cells are generally constructed as a laminate of organic EL materials and electrodes of opposite polarity, and one is broadly shown in U.S. Pat. No. 4,356,429, issued in 1982, which includes a hole injector zone between the EL and the anode, which was commonly indium tin oxide (ITO). Since that time, many improvements have been made.

Basically, OLEDs are presently often made by placing an organic light-emitting material between a layer of a conductive material (ETL) that can inject electrons and a layer of a conductive material (HTL) that can inject holes. This arrangement is placed between flanking outer layers of conductive material that serve as electrodes so that, when a voltage is applied between such outer electrode layers, electrons from one layer combine with holes from the other, releasing energy as light, i.e. producing electroluminescence (EL). It is also possible to produce EL emission from certain ETLs and HTLs without the need for a separate EL layer, or to omit the ETL layer. Such devices are described in Burroughes et al., *Nature* 347,539 (1990) and by Braun and Heeger, *Applied Physics Letters* 58, 1982 (1991).

Commonly, such OLEDs were first deposited onto a transparent glass substrate through which the display might be viewed, and these devices have now grown so as to constitute well known multilayer devices where each layer serves a specific function. To make these devices lighter, thinner and more rugged and also to provide flexibility where desired in the ultimate device, glass in OLEDs has now frequently been replaced with a transparent polymeric substrate, and such a substrate may be coated with a transparent conducting material, one or more organic or polymeric layers adjacent an electroluminescent layer and a metal cathode layer. The organic layers provide charge injection and transport from both electrodes into the EL layer where the charge is recombined and emits light. Depending upon the particular design, one or multiple organic hole transporting layers (HTLS) may be provided between the transparent conducting anode and the EL layer, and one or multiple electron injection and transporting layers may be provided between the cathode and the EL layer. However, as a result of these continuing developments, it has been recognized that certain organic materials and essentially cathode materials are particularly sensitive to oxidation and/or degradation upon exposure to atmospheric oxygen and humidity.

For the same reasons of desiring to reduce weight and thickness, increase durability and impart flexibility, polymer layers have also begun to replace glass in LCDs. As a result, degradation of the liquid crystal materials over time has become of more concern because LCDs can also experience similar problems upon exposure to the environment. For example, U.S. Pat. No. 4,709,991 discusses the need to protect LCDs from exposure to oxygen and water vapor.

To prevent OLEDs and LCDs from degrading in their performance as a result of the intrusion of oxygen and/or moisture through transparent polymers being used as a substrate, e.g. polyesters, such as polyethylene terephthalate (PET) or polyethylene naphthalate (PEN), it has been necessary to apply sealing layers to these polymers that serve as barriers to oxygen/moisture flow therethrough. One method of providing such barrier layer protection is through the application of a multitude of layers deposited from a high vacuum, vapor atmosphere, and it has been sometimes referred to as the PML technique, i.e. for polymer multilayer technique (see U.S. Pat. No. 5,032,461). U.S. Pat. No. 5,757,126 also describes depositing a multilayer overcoating upon a plastic substrate using web processing equipment by applying alternating layers of polymers and inorganic materials to a flexible web of plastic to create a protected substrate onto which an OLED can be deposited. When employing monomer flash evaporation, as taught in the '461 patent, the polymer is generally supplied to the substrate surface in the form of droplets of a monomer, about 10 microns or less in size, with the deposited layer of droplets then being polymerized to a film by UV radiation curing, E-beam curing or the like. Metal and/or metal oxide layers have also been deposited on such a polymer film using conventional electron beam vaporization of the type generally employed to deposit metalizing films in a vacuum environment and plasma enhanced chemical vapor deposition (PECVD). While resistance to the passage of oxygen and/or water is substantially improved, compared to uncoated PET substrates, OLEDs made using this basic technique still have limited lifetimes; accordingly, further improvements have continued to be sought.

Although it has been alleged that an improvement in barrier performance may result from the use of plasma-enhanced chemical vapor deposition utilizing an electron cyclotron resonance source, such is considered to be an expensive option and one that may not be truly commercially feasible.

Generally, it is the object of the invention to increase the lifetime of an OLED or LCD, and particularly a flexible LED or LCD or the like, by providing barrier material that has improved resistance to the transmission of oxygen and moisture from the atmosphere which would otherwise cause the slow degradation of an organic color-generating and/or light-emitting layer or other susceptible component, particularly cathode material, which barrier has advantageous overall physical properties. It is a further object of the invention to provide improved methods for making such barrier material, including flexible barrier material, which is useful to prevent the passage of water and oxygen to a display device, such as one which employs a susceptible cathode or one which incorporates organic electroluminescent display material on a flexible plastic substrate.

SUMMARY OF THE INVENTION

The present invention provides methods for making flexible materials which will serve as an excellent barrier to prevent the passage of water and oxygen to a flat panel or flexible display device, particularly to a liquid crystal or an organic electroluminescent device. A polymeric substrate or a first polymeric layer having a reasonably smooth surface is first provided; after pretreatment to smooth and/or activate its surface, a thin, pinhole-free dense inorganic oxide and/or nitride barrier layer is uniformly deposited by ion-assisted sputtering or evaporation which exhibits a further smoothing effect on the polymer surface. A protective polymeric layer may desirably be subsequently deposited atop the dense smooth inorganic layer so as to sandwich it between the two polymeric layers and thereby provide protection against mechanical abrasion or the like that may be encountered during handling. The result is an improved composite flexible material that can be associated with an electronic device, particularly a flexible LCD or OLED, to prevent the degradation of the properties of cathodes and/or organic materials therein to display information and/or emit light as a result of their subsequent reaction with water and/or oxygen. The inorganic layer is preferably an oxide, a nitride or an oxynitride, such as aluminum oxide, aluminum nitride, silicon oxide, silicon nitride, silicon oxynitride and aluminum oxynitride, and mixed oxides may be preferred. Additional layers as known in the art, e.g. a thin layer of aluminum or silver, may optionally be included in a region of an OLED where transparency is not required.

The barrier layer material may be fabricated separately and then associated with an LCD or OLED as by lamination thereto; however, when the improved barrier layer arrangement is being used to protect flexible OLEDs, its components may be profitably deposited directly upon a flexible substrate to form an effective barrier material, with the OLED being subsequently built in situ upon it. It may also be feasible to fabricate the barrier material in situ upon such an OLED, instead of associating it therewith by lamination thereto. The barrier material may also be advantageously associated with other organic electronic display devices, such as flat panel and flexible LEDs and LCDs.

In one particular aspect, the invention provides a method of making a flexible barrier material to prevent the passage of water and oxygen to a device which incorporates organic display material, said method comprising the steps of providing a polymer layer, depositing an inorganic barrier layer on the polymer layer by ion-assisted sputtering or evaporation, and depositing a second polymer layer on said inorganic layer, whereby a composite barrier material is provided that can be associated with an electronic display device to prevent degradation of the properties thereof as a result of passage of water and/or oxygen.

In another aspect, the invention provides a method of making a flexible barrier material to prevent the passage of water and oxygen to a device which incorporates organic display material, said method comprising the steps of subjecting a polymer layer to pretreatment by an ion-gun-generated plasma under vacuum conditions in the presence of a partial oxygen pressure, and depositing a transparent inorganic barrier layer on the pretreated polymer layer using ion-assisted sputtering or evaporation, whereby a barrier material is provided that can be associated with an electronic display device to prevent degradation of the properties thereof as a result of passage of water and/or oxygen.

In a further aspect, the invention provides a method of making a flexible composite barrier material to prevent the passage of water and oxygen to an electronic display device which incorporates organic material, said method comprising the steps of providing a flexible polymeric substrate, pretreating a surface of said polymeric substrate with an ion gun generated plasma in the presence of an oxygen atmosphere of between about 0.1 to about 10 millitorrs so as to provide a smoothing of said surface, depositing a dense inorganic barrier layer which is essentially free of pinholes onto said pretreated polymeric surface by ion-assisted sputtering or evaporation, and depositing a protective polymer layer onto said inorganic barrier layer, whereby a composite material is provided that is useful as a base for the construction of an organic electronic display device that will withstand degradation of its properties by water and/or oxygen.

DETAILED DESCRIPTION OF THE PREFERRED EMBODIMENTS

Flexible OLEDs constitute one area of significant present interest for this invention; they basically include a flexible polymeric substrate which is coated with a semitransparent coating of ITO that serves as an anode on which an HTL layer is deposited, atop of which a layer of electroluminescent (EL) material is deposited, atop of which an ETL may be deposited before a cathode electrode layer is deposited to complete the light-emitting cell. For such a flexible display cell to have a commercially valuable lifetime, it is most important that it be sandwiched between effective barrier materials on both flanking surfaces; whereas OLEDs fabricated on glass substrates generally need to only be so protected on their top and side surfaces.

Present-day devices generally use a transparent substrate, a transparent anode, a hole transport layer, a polymeric light-emitting layer, an electron transport layer, a metal cathode and oxygen/moisture sealing layers atop the cathode. In flexible OLEDs, barrier material may be associated above and/or below the flexible substrate. Of course, if it is only required that an OLED transmit light through one surface, the opposite surface may include one or more opaque metal barriers which have high resistance to the passage of oxygen/moisture. Such is presently true for many LCDs in commercial applications. Polyesters, such as optical grade PET which is commercially available from GE and duPont, have been conventionally used for the flexible substrate, but the preferred flexible substrate material is heat-stabilized PET or PEN. However, polyacrylonitrile (PAN), polycarbonate or certain polyurethanes may alternatively be employed, which are generally known in this art to provide suitable characteristics for flexible OLEDs.

The anode electrode has commonly been made of inorganic ITO, which is capable of being deposited at a low temperature upon a PET substrate or the like. Other such materials, such as conductive polyaniline, polypyrrole or polythiophene, including combinations thereof, that also have acceptable transparency may alternatively be used. Generally, an ITO anode layer, when used, will be between about 1,000 angstroms and 5,000 angstroms in thickness.

These transparent electrodes can be also formed by the use of well known pattern processes to provide a desired pattern.

An HTL or charge transport layer of a polymeric organic material is then deposited atop the ITO or other anode, as by using a suitable process, such as vacuum deposition or spin-coating. Suitable materials for these HTLs are well known in the art and are described, for example, in U.S. Pat. Nos. 5,703,436 and 5,844,363. For example, derivatives of p-phenylene vinylene may be used. Moreover, HTL may be made of a nonpolymeric material, e.g. biphenyl bridged diamine, such as TPD (N,N'-diphenyl-N,N'-bis(3-methylphenyl)1,1'-biphenyl-4,4'-diamine), and such may be vacuum-deposited on top of the ITO layer. The HTL will generally be between about 50 angstroms and 1,000 angstroms in thickness and preferably between about 200 and 400 angstroms in thickness.

A light-emitting layer is formed atop the HIL, and one suitable light-emitting layer is 1,4-diphenylbutadiene. There are a large number of known organic light-emitting compounds that can be employed, which may be deposited by using standard thin film techniques such as vacuum evaporation, and these are described in *Appl. Phys. Letter* 67,3853 and *Appl. Phys. Letter* 69, 3309. Many other suitable light-emissive layers are known in the art, and these include polymeric materials, e.g. poly(2-methoxy-5-(2'-ethyl-hexyloxy)-p-phenylenevinylene (MEH-PPV), poly(2-methoxy-5-(2-methylpentyloxy)-1,4-phenylenevinylene), poly(2-methoxy-5-pentyloxy-1,4-phenylenevinylene), poly(2-methoxy-5-dodecyloxy-1,4-phenylenevinylene) and poly(3-dodecylthienylene). Very generally, the light-emitting layer will be between about 50 angstroms and about 250 angstroms in thickness. In some instances, it may be possible to combine the EL layer and one of the flanking layers into a single layer. Moreover, although a single light-emitting layer is preferably employed, the use of a number of sublayers that facilitate the injection of holes and electrons to an EL layer are known in the art, and such can alternatively be used.

The electron transport layer (ETL) may be a polymeric material, i.e. 2-(4-biphenylyl)-5-(4-tert-butylphenyl)-1,3,4-oxadiazole (butyl PBD) in a poly(methyl methacrylate) PMMA matrix, or a nonpolymeric material, such as tris-(8-hydroxyquinoline) aluminum ($Alq_3$). Generally the thickness of the ETL will be between about 50 angstroms and about 1,000 angstroms, and preferably in the range of about 200 to 500 angstroms. As mentioned above, it may be possible to combine the light-emissive layer and the ETL into a single layer.

The final operative layer is the cathode, and alkali metals, alkaline earth metals and rare earth metals are examples of suitable materials that may be used as the cathode. Calcium, magnesium and alloys of magnesium and silver (MgAg) are commonly used as a cathode. They can be deposited using various printing techniques, or they are vapor-deposited using shadow masking as well known in this art Generally, the cathode may be as thin as about 50 to 100 angstroms if desired. However, if the cathode layer need not be transparent, then a cathode two or three times as thick may be employed, or an aluminum cap may be applied to a thin Ca cathode or the like.

All of the foregoing components are considered to be fairly conventional in this OLED art, and the present invention is primarily directed to the need to effectively protect or encapsulate organic light-emitting display devices, or other similar information display devices, to prevent oxygen and moisture from reaching the cathode and/or the light-emitting layer or liquid crystal layer over an extended lifetime, while not unduly detracting from its desired optical and physical characteristics. The protecting structures are multilayered and preferably include a laminate of an inorganic oxide and/or nitride which is carefully crafted and sandwiched between two layers of polymer. Moreover, such arrangements may be duplicated, because greater barrier resistance may result from two thinner layers rather than one of twice the thickness. Many of the materials that are used are conventional and known in this art; however, the overall fabrication process employed provides the improvement sought in this art of protecting OLEDs and other similar information display devices.

In the formation of the barrier material, depending upon the substrate being used, a suitable polymerizable and/or cross-linkable resin may be deposited so as to provide a first polymer layer having an ultrasmooth surface upon which an inorganic barrier layer is then deposited. When a barrier material is being formed separate from a display device (so that a display device would be thereafter associated therewith, as by lamination, or formed thereupon), it may now be possible to obtain commercially available polymeric substrates having a sufficiently smooth surface, so that following initial treatment it may be appropriate to deposit an inorganic barrier material directly thereupon. It has been found that ion-beam oxygen treatment of the surface followed by an ion-assisted vacuum deposition of the inorganic barrier used has an unexpected, very substantial smoothing effect. When an ancillary first polymer layer is used, or when an overlayer is used, polymeric resins may, but need not necessarily, be employed which resist oxygen and moisture transmission. These might include fluorinated resins, such as polytetrafluoroethylene and polychlorotrifluoroethylene, polyethylenes, polypropylenes, polysiloxanes, such as hexamethyldisiloxane, polyvinyl alcohol and polycarbonate; however, polyacrylate resins may be preferred as they exhibit some significant inherent resistance to the transmission of oxygen/moisture, which would then be additive to that of the primary barrier layer. Suitable polyacrylate resins include polymers obtained from acrylic monomers, such as acrylic and methacrylic acids, their salts, esters, amides and corresponding nitrites, and examples of commercially available resins include polyethylacrylate, polymethacrylates, e.g. polymethyl methacrylate, copolymers of ethylene and acrylic acid, e.g. ethylene glycol diacrylate, copolymers of polyethylene and ethyl acrylate, and copolymers of polyvinyl butyral or other suitable vinyls. Polyacrylate resins can be applied so as to present an ultrasmooth surface; by careful coating or depositing, they may have a very low surface roughness, e.g. RMS of about 2 nm or less. Generally, a surface having an RMS of about 10 or less is considered to be ultrasmooth for purposes of this application. When a polymeric resin is used to deposit such a first polymer layer, it may be applied as a polymer or prepolymer, or a monomer can be employed and polymerized at or on a substrate.

These multilayer barrier materials can be formed separately and then subsequently associated with information display materials to be protected by lamination thereto, using adhesives, heat-sealing or the like; alternatively, they may be formed in situ thereupon or upon a substrate which will then be used in the fabrication of the display device. Fabrication of the barrier material usually begins with the provision of a polymeric substrate (referred to broadly as a polymer layer) that is usually a commercially purchased polymeric film; however, the substrate could be fabricated as a part of the overall production method if desired, as by coating on a drum, a smooth belt, a flat plate or the like, with coating being controlled so as to produce an ultrasmooth surface or a nearly ultrasmooth surface upon which the inorganic barrier layer is then deposited. When the surface characteristics of the commercial film are felt to be inadequate for whatever reason, an ancillary polymer layer may be deposited using a suitable coating process, such as liquid roll coating, spin coating, spraying, painting or casting upon a suitable commercial film surface and may also be employed to create a film of suitable smoothness; e.g. liquid roll coating under vacuum conditions would provide a suitable polymer surface. Carefully coating a polymeric layer onto a smooth rotating drum, as generally described and taught in U.S. Pat. No. 4,954,371, under carefully controlled conditions, might also be used to produce a continuous length of polymeric material having a desired thickness and smoothness.

An inorganic oxide and/or nitride is then deposited upon the desired surface of polymeric film which, as indicated above, need not be ultrasmooth to provide the primary oxygen/moisture barrier. However, prior to deposition of the inorganic barrier layer, it is desirable to subject the surface of the polymer layer to plasma treatment, preferably in the presence of oxygen. It has surprisingly been found that treatment with an ion-beam generated plasma in the presence of oxygen results in a polymer layer that has high surface uniformity, is free from pinholes and exhibits good adhesion properties. The ion gun, located at a suitable distance from the surface and operating at a voltage of about 50 eV to 250 eV in an oxygen atmosphere of at least about 0.5 millitorr, can be used to bombard the ultrasmooth polymer surface to effect cleaning. Although some other plasma cleaning source may instead be employed, the above technique is preferably used because of the excellent ultimate results therefrom.

Metal oxide barrier layers have been deposited using a variety of vacuum processes like RF or mid-frequency sputtering of ceramic targets. Reactive sputtering of metallic targets can also be employed using DC or mid-frequency methods with appropriate reactive gases in the reaction chamber. It has been surprisingly found that this process is very advantageously performed by using ion beam-assisted, i.e. ion-assisted, vacuum deposition which enhances both film density and flatness. It has been found that the action of the ion gun at the surface of the polymer layer has a very pronounced smoothing effect upon the polymer surface in addition to filling in any small valleys that remain with the inorganic material. As a result, reactive thermal or e-beam evaporation methods coupled with such an ion-beam assist have been found to result in the formation of the desired inorganic barrier layers having improved characteristics at very low thicknesses, and acceptable barrier materials can be fabricated even when the starting materials are commercial thermoplastic films having some significant surface roughness.

The inorganic barrier layer material should be a high density metal oxide, nitride or oxynitride. Preferred oxide materials include oxides of metals and metalloids, such as those of silicon, aluminum, indium, zinc, titanium, cerium, tantalum or niobium. if silicon oxide is used, the preferred stoichiometry is $SiO_x$ (x=1.4–2.0). Preferred nitride materials include silicon, aluminum and tantalum nitrides. The inorganic barrier layer material may also be a mixed oxide, mixed nitride or oxynitride.

Examples of mixed oxides include indium tin oxide (ITO), indium zinc oxide (IZO), indium cerium oxide (ICO) and composite mixes of aluminum and silicon oxides (AlSiO). Although ITO and IZO have previously been used as electrodes, i.e. anodes, in display devices such as these, it has been found that IZO functions very well as a moisture/oxygen barrier layer. Preferred ratios for ITO, IZO and ICO range from 50/50 to 90/10. 90/10 (i.e. 90 wt. % indium, 10% tin) is most preferable for ITO, and 80/20 is most preferable for IZO and ICO. Preferred ratios for AlSiO range from 50/50 to 90/10; most preferable is 60/40 because it appears to have the least risk for forming cracks. Mixed nitrides include silicon aluminum nitride and the like. Suitable oxynitrides include silicon oxynitride, aluminum oxynitride, silicon aluminum oxynitride and the like. Although IZO may be particularly preferred for certain applications, silicon and/or aluminum oxides may be chosen from strictly a cost standpoint when they provide adequate barrier properties.

Aluminum and silicon are likewise among the preferred metals for this key barrier layer when the desire is to apply the layer using reactive sputtering. Such an inorganic oxide or nitride layer can be carefully deposited onto an appropriately smooth surface of a polymeric film using ion-assisted sputtering or evaporation under controlled conditions to provide uniformity and high density. An IZO layer may also be deposited using a mixed oxide starting material. Preferably an argon ion or an oxygen ion gun is employed, or a gun using a mixture of oxygen and argon may be used. If an inorganic nitride layer is being deposited, a nitrogen ion gun may be instead employed.

Deposition of the barrier layer is carried out in a standard high vacuum apparatus of the type well known for this general purpose of vacuum deposition of thin layer films. It is considered most important to be able to provide a layer of desired thickness and uniformity which is devoid of pinholes, which is adequately transparent and which has adequate high density to serve as an effective barrier. Generally, the thickness of the inorganic barrier layer will be between about 100 and 1500 angstroms, and preferably between about 200 and about 800 angstroms. Preferably, its density is at least about 80% of theoretical maximum density, and more preferably about 90% or greater. It has also been found to be advantageous to interrupt the deposition about halfway through the step so as to, in essence, create two decoupled layers which together provide the desired thickness.

The high vacuum chamber should have a very low pressure, i.e. measured in millitorrs; a millitorr is equal to $10^{-3}$ mm of Hg. Generally, the pressure in the deposition chamber should be maintained at between about 0.1 and about 10 millitorr, and preferably it is maintained at a level not greater than about 0.4 millitorr. It will of course be recognized that at these pressures there will be an extremely minute atmosphere. If an oxide film is being deposited by vaporization of an inorganic oxide starting material, the residual atmosphere in the chamber might be oxygen or an inert gas such as argon. Gas is slowly bled into the chamber in the vicinity of the ion gun; however, some gas may be provided to the chamber through a suitable port located elsewhere for background pressure therewithin. If an oxide film is being reactively deposited by ion-assisted sputtering or vaporization of elemental aluminum or silicon, oxygen would be introduced into the chamber in the vicinity of the ion gun. Similarly, $N_2$ could be used if a nitride film were being deposited.

The temperature of the polymeric layer on top of which the inorganic barrier layer is being deposited is preferably maintained at about 100° C. or below and more preferably at 50° C. or below, depending of course upon the character of the polymer. The temperature that is maintained is generally determined by the temperature that the substrate polymeric film can withstand without deterioration when the very thin layer of inorganic barrier material is being deposited upon such a substrate. However, if an ancillary polymeric film has been deposited upon a polyester substrate or the like, as for example for the purpose of thereafter fabricating an OLED in situ thereupon, the characteristics of the OLED substrate may also be taken into consideration in the choice of temperature and polymer. In this respect, polyester materials should generally be kept at a temperature of about 100° C. or below, although heat-stabilized polyester films in thicknesses of either 5 mil (125 μm) or 7 mil (175 μm) are now commercially available, which are somewhat less sensitive to temperature. If it is a polyacrylate polymer layer that is being coated, a temperature of 100° C. or below is acceptable; however, preferably a temperature of about 50° C. or below is maintained so as to assure there is no adverse effect upon its ultrasmooth surface characteristics.

If evaporation is used to supply the inorganic material, it may be by thermal or electron beam (EB) vaporization; however, preferably a sputtering process is used to supply the inorganic oxide vapor, e.g. RF sputtering, mid-frequency sputtering and Twin Mag sputtering. For example, sputtering using a standard magnetron cathode usually using an RF power of 200 to 600 watts, preferably not more than about 400 watts, to bombard the target may be used to vaporize IZO, $Al_2O_3$, $SiO_2$ or $SiO_xN_y$, for example. Sputtering is well known in this art and is effective to create a plasma of vaporized molecules that will reach the substrate. The material being vaporized may be the inorganic oxide or nitride itself, or reactive deposition may be used where elemental silicon or aluminum is vaporized and then reacted with ions from a beam of either oxygen or nitrogen at the substrate surface. For example, where elemental silicon is being supplied via evaporation, an oxygen ion gun is preferably employed, with oxygen being introduced into the chamber in the vicinity of the gun to facilitate creating the beam of oxygen ions.

When the layer is being deposited by vaporizing $Al_2O_3$ or $SiO_2$ for example, a gridless ion gun is carefully controlled so as to bombard the ultrasmooth polymer surface with a 50 to 250 eV argon or oxygen beam, and preferably an argon beam between about 50 and about 200 eV is employed and a beam current of 10–1,000 milliamperes, preferably 20–500 milliamps. In either instance, where vaporization of the oxide material is occurring or where a reactive deposition is occurring, the ion beam is directed at the surface of the polymeric film with an orientation chosen so as to assure complete coverage of the substrate, e.g. a beam angle of about 30°, and create a thin film having uniformity, high density and resistance to cracking upon flexing.

Once the key inorganic barrier material has been deposited, it may be desirable to coat it with a protective polymeric layer. Such would generally be of the same material as the underlying surface upon which the barrier has been deposited; however, other suitable polymers may be alternatively employed It is also presently believed that the use of multiple barrier layers may be of advantage; thus, it may be desirable that a second inorganic barrier layer, having characteristics similar to those described for the first barrier layer, be deposited onto the protective polymer layer. If so, it in turn might be covered with a third polymer layer. The protective polymer layer(s) would have about the same thickness as described hereinbefore with respect to the first polymer layer, namely between about 200 and about 800 angstroms and would be applied in the same way, i.e. preferably through a vapor deposition process. When a web-coating process is used, one primary function of such additional polymer layers would be to provide abrasion protection where the coated film comes in contact with guide rollers.

Furthermore, there may be advantages to, instead of using a single inorganic layer of continuous thickness, employing two thinner layers either by (a) interrupting the deposition of the inorganic material to demarcate the end of one layer and the beginning of an adjacent layer or by (b) using a change in inorganic material for the second layer after halting deposition of the first. In such an arrangement, the first inorganic layer that was deposited would serve as a primary barrier, and the second layer would serve to protect the first layer during any subsequent coating steps while at the same time inherently providing resistance to the intrusion of oxygen and moisture. During a web-coating process, for example, when coating is carried out in a mass production manner on a substantially endless roll of sheet material, every so often it is necessary for the sheet surface to be contacted by rollers to change its direction and provide overall guidance. By arranging the deposition so as to have a second inorganic layer in place before contact with the rollers occurs it is possible to provide physical protection against the creation of possible imperfections in the primary barrier layer that might result from such contact. Very generally, each of the layers would have a thickness between about 100 and about 1,000 angstroms and would usually be between about 200 and 500 angstroms.

As indicated above, the inorganic barrier layer may desirably be covered by a protective polymer layer between about 0.5 and 1 micron in thickness, which might be applied in any one of a variety of ways, including liquid roll-coating, thermal evaporation, flash evaporation, spin-coating, miniscus coating or even immersion coating. Such an arrangement would provide more latitude in overall coating techniques stemming from the fact that the primary barrier layer is protected against potential abrasion in subsequent handling steps by the second layer. Moreover, because, as indicated above, it is felt that there may be value in using relatively thinner thicknesses of barrier materials and depositing multiple layers of them, it may be desirable to deposit two more inorganic layers atop such a polymer layer and in turn sandwich them using a second protective polymer layer.

A particularly attractive alternative to depositing such a multiple arrangement of barrier layers on one surface of the polyester or other suitable film substrate is to coat both surfaces of the substrate. In such an arrangement, both surfaces could optionally first be coated with a polymer layer to provide the desired surface smoothness; however, it may be possible to use commercially available heat-stabilized PET or PEN films that are now being produced which have high smoothness, e.g. an RMS of about 2 nm or less. A pair of inorganic layers would then be deposited after preferably pre-treating the surfaces, as described above, on both opposite surfaces, and each would be optionally covered with a polymer layer. Such an arrangement should provide the same overall resistance to the transmission of oxygen and/or moisture as when a duplicate arrangement is deposited on the same surface of the PET or other substrate, and there could well be economies of production, as by simultaneously treating both surfaces. If it were desired to build an OLED on such an arrangement, an ITO anode or the like might be deposited on either one of the surfaces and the information display material sequentially applied thereto; in the alternative, such a dual barrier material could first be fabricated and then laminated to an existing information display material.

As also previously mentioned, a pair of such composite barrier materials might be provided and associated so as to flank an OLED. However, in most cases, an information display device is designed so that light will be transmitted only through one surface, e.g. in an LCD, and as a result, there are more options for creating the other surface. For example, thin metal layers that are opaque but serve as excellent barriers to oxygen and moisture can be deposited instead of or in addition to the afore described inorganic oxides.

Traditionally, when manufacturing a flexible LED, an anode is deposited upon a polyester substrate or the like, and laminations are then built up thereupon as mentioned hereinbefore. In such an instance, the oxygen/moisture barrier material of the present invention either can be deposited in situ upon the completed display material or can be formed separately and then associated therewith (at one or both surfaces). Such an arrangement will serve as an effective barrier to intruding oxygen and/or moisture reaching the cathode itself (which is very often particularly susceptible to degradation) and/or reaching an organic EL layer. Such an arrangement generally grew out of the original OLEDs wherein a glass substrate was used that was highly impermeable to oxygen and moisture, as a result of which the protective encapsulation was located atop the cathode and along the edges of the unit.

When a flexible polyester substrate, for example PET, e.g. about 100 µm to 175 µm thick, is employed, the polyester provides some resistance to oxygen/moisture penetration; however, it is still felt that barrier protection will be needed. Therefore, in one preferred arrangement, such a flexible display device is created in situ upon such a barrier material-protected substrate. Such a composite substrate can be provided either by laminating a previously formed multi-layer barrier material to a PET film, or preferably by building the barrier material by deposition onto one or both surfaces of PET film or sheeting.

When the latter option is employed, a polymer layer may be optionally applied to the surface of the polyester film using a suitable coating method, such as roll coating of a liquid, flash evaporation, or a like method. However, as previously mentioned, with the commercially available heat-stabilized PET and PEN films and with the optional ion-beam oxygen treatment, such an initial polymer layer may be unnecessary. If used, the polymer layer may preferably be provided by coating with an acrylic monomer, such as methylmethacrylate, ethylacrylate, ethylene glycol diacrylate, tripropylene glycol diacrylate, or some other acrylate or methacrylate and polymerizing it. Halogenated alkenes might also be used. The ancillary polymer layer would be quite thin, having a thickness between about 0.25 micron and 1.5 microns, e.g. about 1 micron, with the understanding that it is desirable to minimize the overall thickness so as not to adversely affect light transmission therethrough while providing a surface of less roughness than the commercial film. For example, a layer of polyethyl acrylate of a thickness of about 0.25–1 micron is applied so as to have a very low surface roughness. By careful control of a coating process, it is possible to apply such a polyacrylate layer with low surface roughness, e.g. with spikes or peaks not greater than about 10 angstroms.

Such an ultrasmooth surface is desirable as a platform upon which the inorganic barrier layer is deposited by ion-assisted sputtering or evaporation; however, as previously mentioned, polymer surfaces of somewhat higher roughness can be tolerated because of the smoothing effect of the ion-beam-assist process. Even more importantly, it has been found that it is feasible to directly deposit a barrier material in this manner upon the surface of certain commercially available films, e.g. heat-stabilized PET having a thickness of about 125 microns (5 mil) sold commercially by duPont by first pretreating the surface in question with an ion-beam generated plasma in the presence of oxygen. The pretreatment is carried out at a voltage between about 50 and 250 volts, preferably between about 100 and 200 volts and more preferably at about 170 volts plus or minus 20 eV. The ion gun creating the plasma is preferably located between about 1 and about 8 inches from the surface of the film being treated, and preferably at about 3 to 5 inches therefrom. The surface of the film is exposed to the oxygen ion-beam generated plasma for about 1 to 15 minutes, and preferably for about 5 to 10 minutes. It is felt that pretreatment of the polymeric film under these conditions not only reduces the surface roughness of the polymer but has an activating effect which improves the adhesion of the inorganic barrier material to be subsequently deposited with ion-assist deposition, and that it also has a decoupling effect whereby pathways transversely through the barrier are disrupted, adding to the overall effectiveness of the resultant product.

As described hereinbefore, once the surface has been prepared, an inorganic barrier material is applied by sputtering an inorganic oxide, such as $Al_2O_3$, $SiO_2$, IZO, or $SiO_xN_y$ under high vacuum conditions measured in millitorrs and carefully controlling an oxygen or argon ion gun in the ion-assisted deposition, which exhibits a smoothing effect and assumes a pinhole-free layer. If desired, a small percentage of a "getter" material, for example metallic lithium, can be included within the oxide, nitride or oxynitride barrier layer. Such will react with oxygen or water and thus further deter penetration past the barrier layer. Such may be accomplished by having a second sputtering station where metallic lithium would be vaporized and directed toward the substrate in a much smaller amount than the $Al_2O_3$, IZO or the like.

Once such a dense, pinhole-free barrier layer has been deposited, a protective polymeric layer of polyacrylate material or another suitable polymer material is deposited there atop, preferably using a flash evaporation process or the like. Thereafter, if desired, a second barrier layer of aluminum oxide or the like can be applied, with either or both of the inorganic layers being interrupted to provide two equally thick half-layers; such would usually be followed by another protective polymer layer. A low amount of lithium could also be added to such a second barrier layer by co-evaporating metallic lithium from a separate source, or by co-sputtering lithium and, for example, aluminum oxide from separate sources. Alternatively, a thin layer of lithium or silver might be separately incorporated, as for example by depositing such atop the protective polymer layer, but such a metal layer would likely not be employed unless the information display panel were one where it was intended that there would be no transmission of light through this particular surface. Accordingly, such an alternative construction would likely be reserved for barrier material to be applied adjacent the cathode of an OLED.

Once the creation of the substrate-barrier material is complete, a flat panel display may then be fabricated in situ there atop, as described hereinbefore by successive depositions of the ITO anode, the HTL, the organic light-emissive layer, the ETL, and a low work function cathode, such as calcium or a calcium-silver alloy. Then a suitable moisture/oxygen barrier may be deposited thereon or associated therewith, which can be generally the same as that just described if desired, or may include opaque layers if there is to be no light transmission through this surface.

One example of fabricating an effective barrier material is carried out as follows: Commercially available PET sheeting having a thickness of about 100 microns is obtained, and flash evaporation as generally disclosed in U.S. Pat. No. 4,954,371 is used to apply a first layer about 0.25 micron thick of polyethyl acrylate. The process is carefully controlled so as to create an ultrasmooth surface as previously described. Atop the thin polymeric surface, a second (barrier) layer about 300 angstroms thick of $SiO_x$ (transparent silicon dioxide) is deposited using ion-assisted RF sputtering of $SiO_2$ where a gridless argon ion gun is operated at about 100 eV, with a beam current of about 200 milliamperes and a beam half-angle of about 30° in an enclosure evacuated to about 0.5 millitorr. Next, a third layer, about 0.25 micron thick, of polyethyl acrylate is deposited, effectively sandwiching the $SiO_x$ barrier layer between the two polyacrylic layers. Then, atop the thin polymeric surface, a fourth (barrier) layer about 300 angstroms thick of $SiO_x$ (transparent silicon dioxide) is deposited, again using ion-assisted RF sputtering of $SiO_2$ with a gridless argon ion gun under the same conditions. Next, a fifth layer, about 0.25 micron thick, of polyethyl acrylate is deposited, sandwiching the $SiO_x$ barrier layer again between the two polyacrylic layers. A layer of ITO about 1500 angstroms in thickness is then uniformly coated atop the second polyacrylic layer, using standard RF sputtering; the result is a barrier film substrate excellently suited for the manufacture of flexible OLEDs by the deposition of multiple layers atop the ITO layer which could function as the anode for the display material. The final product has improved longevity as a result of the improved resistance of the barrier material to the passage of water and/or oxygen that would potentially result in degradation, while itself being of minimal total thickness and fully flexible.

As another example of fabricating an effective barrier material, commercially available heat-stabilized PET sheeting having a thickness of about 125 microns is pretreated by exposure to ion-beam generated plasma for about 5 minutes operating at a voltage of about 170V with the gun positioned about 8 inches from the surface in a vacuum enclosure where oxygen is bled thereinto to maintain an atmosphere of about 0.5 millitorr. Following this smoothing surface treatment, a barrier layer about 300 angstroms thick of $SiO_x$ (transparent silicon dioxide) is deposited using ion-assisted RF sputtering of $SiO_2$ where a gridless argon ion gun is operated at about 100 eV, with a beam current of about 200 milliamperes and a beam half angle of about 30° at an atmosphere of about 0.5 millitorr. Next, the opposite surface of the PET sheeting is similarly pretreated, and then a barrier layer about 300 angstroms thick of $SiO_x$ (transparent silicon dioxide) is deposited atop it, again using ion-assisted RF sputtering of $SiO_2$ with a gridless argon ion gun under the same conditions. Measurement of the resistance of the resultant barrier material to the passage of water and/or oxygen that would potentially result in degradation of a cathode and/or an organic EL layer shows improvement far above that exhibited by flexible, transparent barrier materials of comparable thickness.

It should thus be apparent that when, through improving production methods, films other than heat-stabilized PET and PEN having nearly ultrasmooth surfaces are practical so that one or such a pair of inorganic layers might be deposited directly thereupon, following pretreatment with such an oxygen ion beam-generated plasma, using the afore described ion-assisted deposition process without the need for the application of an initial smoothing layer, thus rendering the process for making of barrier materials even more economical. One further alternative process employs a thinner than normal PET substrate and applies the smoothing layer, if needed, an interrupted pair of inorganic layers and a protective polymer layer as generally described above; thereafter, two thicknesses of such a composite assembly are laminated to each other using an index-type matching adhesive, thereby producing a multilayer barrier material having similar characteristics. Of course, still other combinations of fabrication steps would be suggested to one having the ordinary skill in this art.

Although the invention has been described with regard to certain preferred embodiments which constitute the best mode presently known to the inventors to carry out the invention, it should be understood that various changes and modifications as would be obvious to one having ordinary skill in this art can be made without departing from the scope of the invention which is defined by the claims that are appended hereto. Even though the first working example is directed to producing improved barrier material particularly suited for the formation of a flexible OLED, it should be understood that barrier material such as that described in the second working example may advantageously be employed in protecting other information display devices, such as LCDs and flat panel displays where resistance to degradation from oxygen/moisture transmission is likewise a problem that must be faced. As mentioned previously, although the barrier material has inherent advantages in being able to be used with a flexible OLED or flexible LCD, its thinness, lightness and ruggedness provides significant advantages as a substitute for glass in a flat panel information display unit. Disclosures of all previously enumerated U.S. patents are expressly incorporated herein by reference.

The invention claimed is:

1. A method of making a flexible composite barrier material to prevent the passage of water and oxygen to an electronic display device which incorporates organic material, said method comprising the steps of:
    providing a flexible polymeric film substrate, and
    depositing a dense inorganic barrier layer which is essentially free of pinholes onto a polymeric surface by ion-assisted sputtering using an argon ion gun at a beam half-angle of about 30°,
    whereby a protective material is provided that is useful in the provision of an organic electronic display device that will withstand degradation of its properties by water and/or oxygen.

2. The method according to claim 1 wherein a protective polymer layer is deposited upon said inorganic barrier layer.

3. The method according to claim 1 wherein said polymeric film substate is PET or PEN having a thickness of about 100 to about 175 μm and said surface of said polymeric film is pretreated with an ion gun generated plasma in the presence of an oxygen atmosphere of between about 0.1 to about 10 millitorrs so as to provide a smoothing of said surface.

4. The method according to claim 1 wherein said depositing step is carried out in an enclosure evacuated to between about 0.1 to about 0.5 millitorr.

5. The method according to claim 1 wherein said argon ion gun is operated at between about 50 and about 200 eV, using a beam current between about 20 and about 500 milliamps.

6. The method according to claim 5 wherein said ion-assisted sputtering is ion-assisted RF sputtering.

7. The method according to claim 1 wherein said dense inorganic barrier layer is an oxide, a nitride, or an oxynitride.

8. The method according to claim 7 wherein said dense inorganic barrier layer is silicon oxide, aluminum oxide, or silicon aluminum oxide.

9. The method according to claim 7 wherein said dense inorganic barrier layer which is deposited is a silicon oxynitride, an aluminum oxynitride, or a silicon aluminum oxynitride.

10. The method according to claim 7 wherein said inorganic barrier layer is a silicon aluminum oxynitride and is deposited by reactive sputtering.

11. The method according to claim 10 wherein said reactive sputtering is carried out in an atmosphere containing partial pressures of oxygen and nitrogen.

12. The method according to claim 1 wherein said dense inorganic barrier layer is deposited to a thickness of at least about 300 angstroms and not greater than about 1500 angstroms and has a density of at least about 90% of theoretical maximum density.

13. The method according to claim 12 wherein said dense inorganic barrier layer is deposited to a thickness of not greater than about 800 angstroms.

14. The method according to claim 1 wherein said depositing step is interrupted and then resumed under substantially the same conditions to create two distinct sublayers that constitute said dense, inorganic barrier layer.

15. A method of making a flexible barrier material that is effective to prevent the passage of water and oxygen to a device which incorporates organic display material, said method comprising the steps of:
   providing a flexible polymeric film, and
   depositing an inorganic barrier layer at least about 300 angstroms and not greater than about 1500 angstroms thick on the polymeric film by ion-assisted sputtering using an argon ion gun at a beam half-angle of about 30°,
   whereby a barrier material is provided that can be associated with an electronic display device to prevent degradation of the properties thereof as a result of passage of water and/or oxygen.

16. The method of claim 15 wherein said polymeric film is polycarbonate.

17. The method of claim 16 wherein said polymeric film is bombarded with a 50 to 250 eV argon beam during said depositing step, that is generated using a current of between about 10 and about 1000 milliamps.

18. The method according to claim 17 wherein said inorganic barrier layer is silicon aluminum oxynitride having a thickness not greater than about 800 angstroms.

19. The method of claim 15 wherein said deposition of said inorganic barrier layer takes place at an atmosphere of between about 0.1 and about 0.5 millitorr.

20. A method of making a flexible barrier material to prevent the passage of water and oxygen to a device which incorporates organic display material, said method comprising the steps of:
   subjecting a PET or PEN polymeric film to pretreatment by an ion-gun-generated plasma under vacuum conditions in the presence of a partial oxygen pressure, and
   depositing a transparent dense inorganic barrier layer at least about 300 angstroms and not greater than about 1500 angstroms thick on the pretreated polymer layer by ion-assisted sputtering using an argon ion gun at a beam half-angle of about 30°,
   whereby a barrier material is provided that can be associated with an electronic display device to prevent degradation of the properties thereof as a result of passage of water and/or oxygen.

21. The method of claim 20 wherein said polymeric film is about 100 to about 175 μm thick.

22. The method of claim 20 wherein said polymeric film is bombarded with a 50 to 250 eV oxygen beam during said pretreatment step for between about 1 and about 15 minutes at an oxygen atmosphere of between about 0.1 to 10 millitorr and said pretreated film is then bombarded during said depositing step, with a 50 to 250 eV argon beam that is generated using a current of between about 10 and about 1000 milliamps.

* * * * *

UNITED STATES PATENT AND TRADEMARK OFFICE
CERTIFICATE OF CORRECTION

| | | |
|---|---|---|
| PATENT NO. | : 7,077,935 B2 | Page 1 of 1 |
| APPLICATION NO. | : 10/478221 | |
| DATED | : July 18, 2006 | |
| INVENTOR(S) | : Ziegler et al. | |

It is certified that error appears in the above-identified patent and that said Letters Patent is hereby corrected as shown below:

In the CLAIMS:

Claim 3, column 14, line 53, after "film" delete "substate" and insert --substrate--.

Signed and Sealed this

Third Day of April, 2007

JON W. DUDAS
*Director of the United States Patent and Trademark Office*